(12) United States Patent
Kuo et al.

(10) Patent No.: US 10,019,540 B2
(45) Date of Patent: Jul. 10, 2018

(54) SYSTEM AND METHOD FOR LAYOUT-RELATED VARIATION ANALYSIS

(71) Applicant: TAIWAN SEMICONDUCTOR MANUFACTURING CO., LTD., Hsinchu (TW)

(72) Inventors: Chin-Cheng Kuo, Taoyuan (TW); Wei-Yi Hu, Hsinchu County (TW); Kuang-Ming Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 94 days.

(21) Appl. No.: 14/985,142

(22) Filed: Dec. 30, 2015

(65) Prior Publication Data

US 2017/0193139 A1 Jul. 6, 2017

(51) Int. Cl.
*G06F 17/00* (2006.01)
*G06F 17/50* (2006.01)

(52) U.S. Cl.
CPC ...... *G06F 17/5009* (2013.01); *G06F 17/5045* (2013.01)

(58) Field of Classification Search
CPC .................................................. G06F 17/00
USPC .................................................. 716/103
See application file for complete search history.

(56) References Cited

U.S. PATENT DOCUMENTS

| | | | |
|---|---|---|---|
| 2004/0243374 A1* | 12/2004 | Kundert | G01R 31/318357 703/14 |
| 2005/0132306 A1* | 6/2005 | Smith | G06F 17/5068 716/114 |
| 2005/0235232 A1* | 10/2005 | Papanikolaou | G06F 17/5045 700/33 |
| 2008/0046846 A1* | 2/2008 | Chew | G06F 17/5068 716/51 |
| 2015/0089463 A1 | 3/2015 | Kuo et al. | |

* cited by examiner

*Primary Examiner* — Mohammed Alam
(74) *Attorney, Agent, or Firm* — Maschoff Brennan

(57) ABSTRACT

A method is disclosed that includes performing a first simulation by applying first variations to identify at least one sample of an integrated circuit (IC), wherein the IC comprises at least one device; translating individual variables of split devices implementing the at least one device, to an equivalent variable for the split devices; and performing a second simulation, by applying at least a portion of second variations, with the equivalent variable for the split devices, to obtain a simulation result serving as a basis of modifying the layout for fabrication of the IC.

20 Claims, 3 Drawing Sheets

SYSTEM AND METHOD FOR LAYOUT-RELATED VARIATION ANALYSIS

BACKGROUND

Modern integrated circuits (ICs), which are classified as digital, analog, or mixed signal, provide complex functionality. A single IC includes millions or billions of transistors, each of which switches on and off to cause minute amounts of current to propagate through various pathways within the ICs. In the design phase of an IC, prior to manufacturing, a designer specifies a set of target process parameters, including, for example, gate length, electron mobility, and voltage threshold, for each transistor in the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
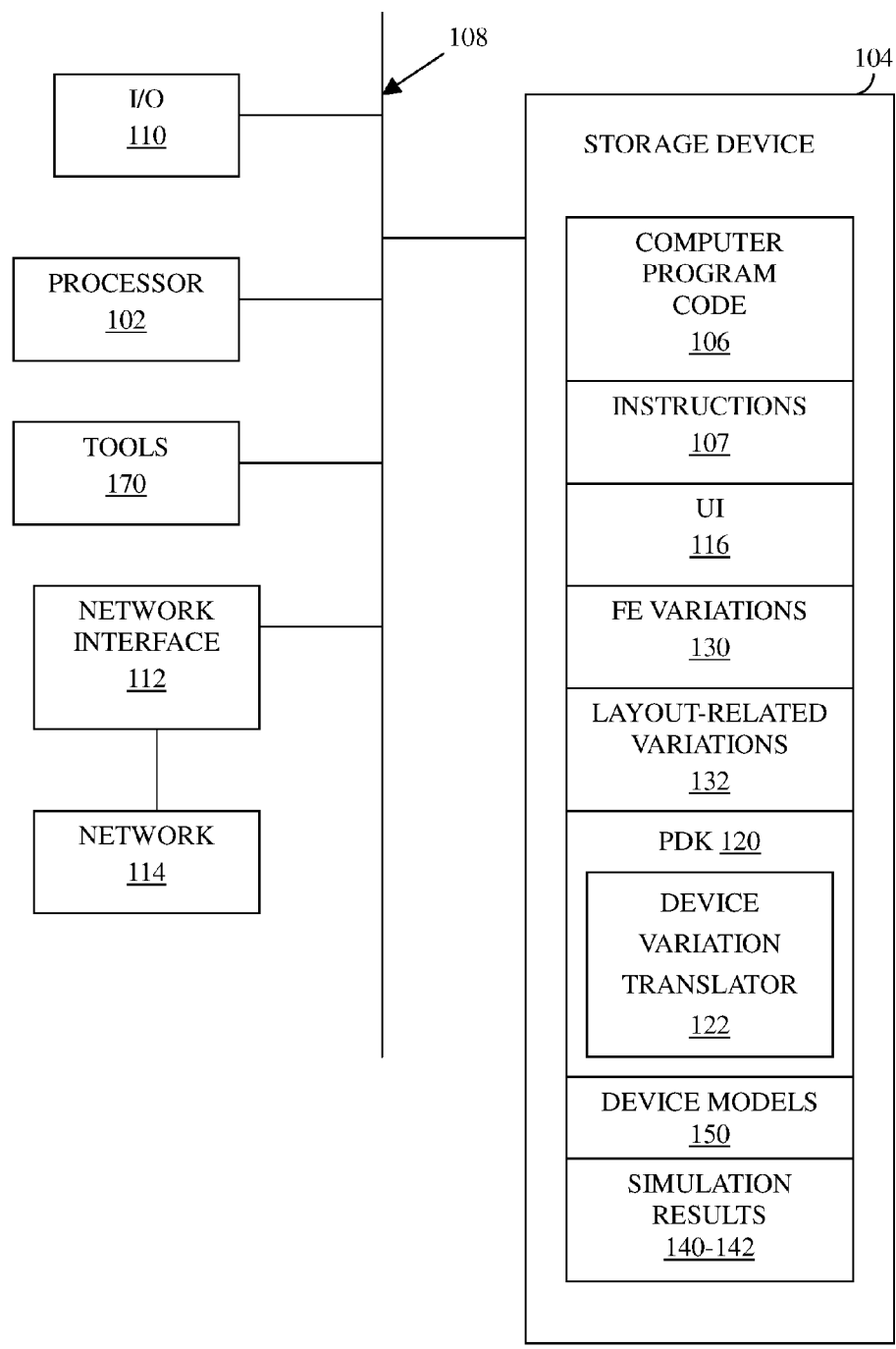
FIG. 1 is a schematic diagram of a system in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

FIG. 1 is a schematic diagram of a system 100 in accordance with various embodiments of the present disclosure. Labels for different components of the system 100 are illustratively provided in FIG. 1. In some embodiments, the system 100 is a computing device, or implemented in a computing device, for variation analysis including, for example, layout-related variation analysis. For illustration, the layout-related variation analysis is associated with layout-dependent factors including, for example, configurations and/or characteristics of devices in an integrated circuit (IC).

For illustration in FIG. 1, the system 100 includes a hardware processor 102 and a non-transitory computer readable storage device 104 encoded with computer program codes 106. Alternatively stated, the computer readable storage device 104 stores a set of executable instructions including, for example, computer executable simulation instructions.

In some embodiments, the computer program codes 106 include, for example, Electronic Design Automation (EDA) codes. In various illustrations, EDA is also referred to as Electronic Computer Aided Design (ECAD) and are used for designing and producing electronic systems, including, for example, ICs. EDA tool has been developed rapidly with the continuous scaling of semiconductor technology.

In some embodiments, the computer readable storage device 104 in the system 100 also stores front-end (FE) variations 130. The FE variations 130 are associated with front-end-of-line (FEOL) processes. For illustration, the FE variations 130 indicate variations of devices in front-end-of-line (FEOL) processes, and are configured to be applied in simulation as discussed below.

In some embodiments, the FEOL processes include, for example, wafer preparation, isolation, well formation, gate patterning, spacer, extension and source/drain implantation, silicide formation, and dual stress liner formation. During the FEOL process, semiconductor structures are formed on a semiconductor wafer.

In further embodiments, during the FEOL process, the various processing steps fall into a number of categories including, for example, deposition, removal, patterning, and modification of electrical properties (i.e., doping). Hereinafter are illustrations of the aforementioned processing categories. Deposition is a process that grows, coats, or otherwise transfers a material onto the wafer. Some examples of deposition processes or techniques include physical vapor deposition (PVD), chemical vapor deposition (CVD), electrochemical deposition (ECD), molecular beam epitaxy (MBE), atomic layer deposition (ALD), and the like. Removal is a process that removes material from the wafer in bulk, including, for example, etching processes. For example, chemical mechanical planarization (CMP) is a typical removal process used between levels of a device. Patterning processes are those that pattern the shape of deposited materials. Patterning is also referred to as lithography. A typical patterning process includes using a photoresist material to selectively mask portions of the semiconductor device, exposing the device to a particular wavelength of light, and then washing away the unexposed regions with a developer solution. Electrical properties are altered by doping selected regions by diffusion and/or ion implantation. The doping processes are typically followed by an anneal process, including, for example, a furnace anneal or rapid thermal anneal (RTA), in order to activate the implanted dopants.

In some embodiments, the computer readable storage device 104 in the system 100 also stores the layout-related variations 132. The layout-related variations 132 are associated with layout-related effects. For illustration, the layout-related effects are associated with layout dependent effect (LDE), middle-end-of-line (MEOL) processes, and back-end-of-line (BEOL) processes. For illustration, the layout-related variations 132 indicate variations of devices and the connections thereof, in LDE, MEOL, and BEOL processes, and are configured to be applied in simulation as discussed below.

In some embodiments, the MEOL process includes, for example, gate contact formation. After the FEOL process in which semiconductor structures are formed on a semiconductor wafer, the semiconductor structures are locally interconnected during the MEOL process to produce the IC.

In some embodiments, the BEOL processes include, for example, a series of wafer processing steps. The wafer processing steps are performed to interconnect the semiconductor structures formed during the FEOL and MEOL processes.

In various embodiments, the layout-related variations 132 are associated with environment variations. The environment variations include, for example, voltage, temperature, and so on.

In some other embodiments, the computer readable storage device 104 in the system 100 also stores a process design kit (PDK) 120 with a device variation translator 122. In some alternative embodiments, the computer readable storage device 104 in the system 100 also stores device models 150 for the device variation translator 122. Operations associated with the device variation translator 122 and the device models 150 are explained below.

For illustration in the system 100, the processor 102 is configured to execute the computer program codes 106 associated with simulation instructions, encoded in the computer readable storage device 104. Accordingly, the system 100 is operable for performing various simulations.

In some embodiments, the system 100 applies FE variations 130 to a first simulation. For illustration, the processor 102 executes the computer program codes 106 to apply the FE variations 130. Accordingly, the first simulation is performed, and a simulation result 140 is accordingly obtained. In some other embodiments, the system 100 applies a portion of the layout-related variations 132 to a second simulation. For illustration, the processor 102 executes the computer program codes 106 to apply the device variation translator 122. The second simulation is accordingly performed by using the simulation result 140, and a simulation result 141 is thus obtained. In some alternative embodiments, the system 100 applies all of the layout-related variations 132 to another second simulation. For illustration, the processor 102 executes the computer program codes 106 to apply the device variation translator 122. The second simulation is accordingly performed by using the simulation result 140, and a simulation result 142 is thus obtained. In further embodiments, the simulation result 141 or the simulation result 142 serves as a basis of modifying the layout for fabrication of the IC.

In some other embodiments, the computer readable storage device 104 is also encoded with instructions 107 for interfacing with tools 170 including, for example, manufacturing equipments, chambers, or the like. For illustration, the tools 170 are configured for producing IC, in some embodiments, based on the aforementioned modified layout.

In some embodiments, the tools 170 perform various semiconductor processes including, for example, etching, deposition, implantation, and annealing. The tools 170 include, for example, photolithography steppers, etch tools, deposition tools, polishing tools, rapid thermal anneal tools, ion implantation tools, and the like. Each tool 170 modifies the wafer according to a particular operating recipe. For illustration, one tool 170 is configured to deposit a film having a certain thickness on a wafer, and another tool 170 is configured to etch away a layer from a wafer. Furthermore, in some embodiments, the tools 170 of the same type are designed to perform the same type of process.

In other embodiments, the storage device 104 stores instructions 107 for interfacing with external machines. The instructions 107 enable the processor 102 to generate instructions readable by the external machines to effectively implement the operations during analysis.

For illustration in FIG. 1, the processor 102 is electrically coupled to the computer readable storage device 104 via a bus 108. The processor 102 is also electrically coupled to an I/O interface 110 via the bus 108. A network interface 112 is also electrically connected to the processor 102 via the bus 108. The network interface 112 is connected to a network 114, so that the processor 102 and the computer readable storage device 104 are able to be connected to external elements via the network 114. In some embodiments, the network 114 is a public network, including, for example, the Internet, or alternatively, the network 114 is a private network owned or operated by the foundry. Various networks to implement the network 114 are within the contemplated scope of the present disclosure.

In some embodiments, the processor 102 is a central processing unit (CPU), a multi-processor, a distributed processing system, an application specific integrated circuit (ASIC), a suitable processing unit, or the like. Various circuits or units to implement the processor 102 are within the contemplated scope of the present disclosure.

In some embodiments, the computer readable storage device 104 is an electronic, magnetic, optical, electromagnetic, infrared, storage system (or apparatus, or device). For example, the computer readable storage device 104 includes a solid-state memory, a magnetic tape, a removable computer diskette, a random access memory (RAM), a read-only memory (ROM), a rigid magnetic disk, and/or an optical disk. For illustration of optical disks, the computer readable storage device 104 includes a compact disk-read only memory (CD-ROM), a compact disk-read/write (CD-R/W), and/or a digital videodisc (DVD).

In some embodiments, the storage device 104 stores the computer program codes 106 configured to cause the system 100 to perform one or more operations. In some other embodiments, the storage device 104 also stores information generated during performing the operations. The information includes, for example, a user interface (UI) 116, the FE variations 130, the layout-related variations 132, the simulation result 140-142 and/or a set of executable instructions 107. In some embodiments, the UI 116 is a graphical user interface (GUI).

In some embodiments, the I/O interface 110 is electrically coupled to external circuitry. The I/O interface 110 includes, for example, a keyboard, keypad, mouse, trackball, trackpad, touch screen, and/or cursor direction keys, for communicating information and commands to the processor 102. In various embodiments, the I/O interface 110 includes, for example, a display, including, for example, a cathode ray tube (CRT), liquid crystal display (LCD), a speaker, and so on.

For illustration in FIG. 1, the network interface 112 allows the system 100 to communicate with the network 114, to which one or more computer systems are connected. In some embodiments, the network interface 112 includes wireless network interfaces including, for example, BLUETOOTH, WIFI, WIMAX, GPRS, or WCDMA. In some other embodiments, the network interface 112 includes wired network interfaces including, for example, ETHERNET, USB, or IEEE-1394. For illustration, information including, for example, UI 116, the FE variations 130, the layout-related variations 132, and/or the simulation result 140-142, are exchanged via the network 114 between different systems including the system 100.

Figure 2:
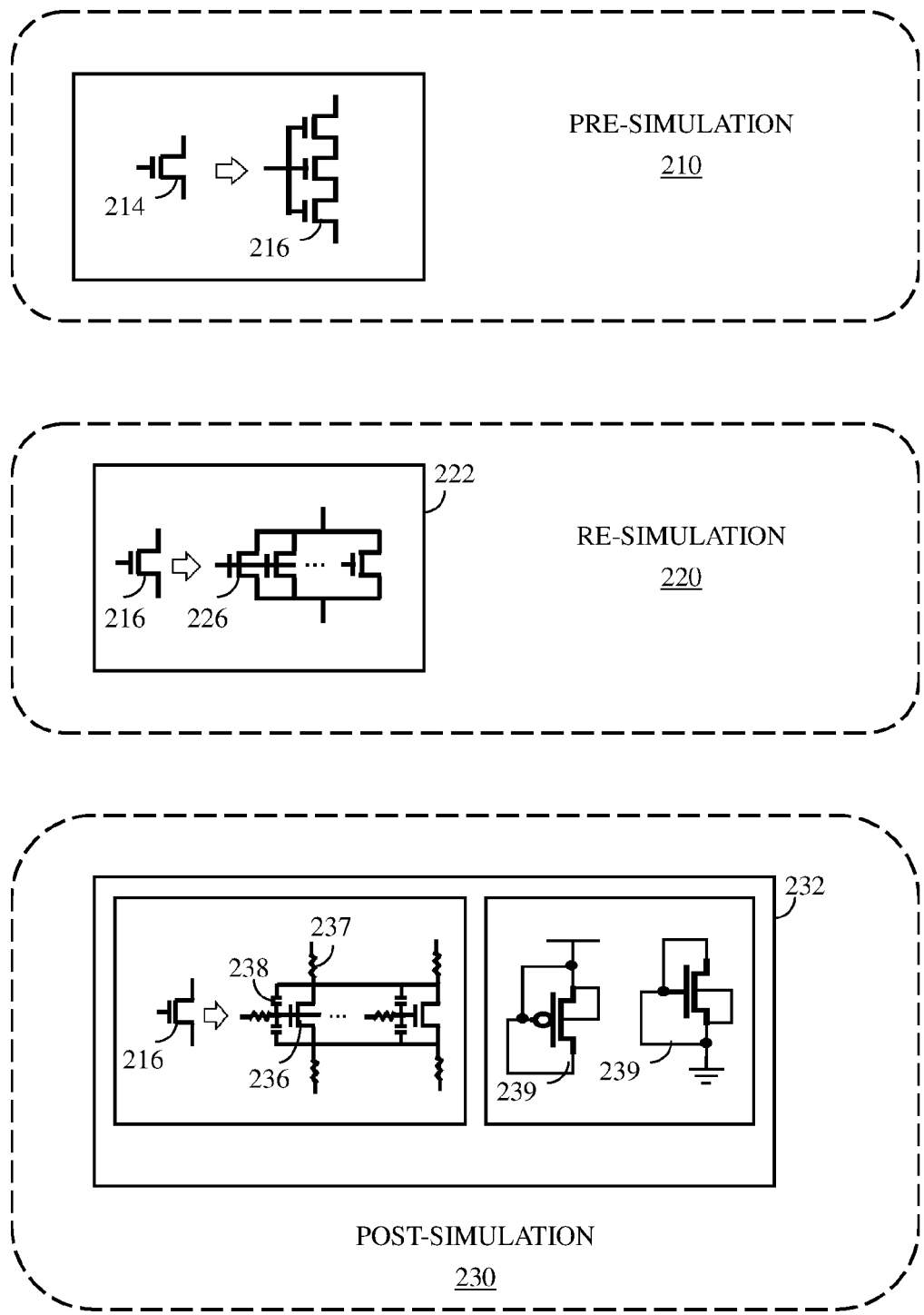
FIG. 2 is a schematic diagram of illustrating various simulations implemented by the system 100 in accordance with various embodiments of the present disclosure.

For explaining various simulations performed by the system 100, reference is made to FIG. 2. FIG. 2 is a schematic diagram of illustrating various simulations implemented by the system 100 in accordance with various embodiments of the present disclosure. The operations of the system 100 in FIG. 1 are described below with the simulations illustrated in FIG. 2. Labels for different simulations are illustratively provided in FIG. 2.

For illustration in FIG. 1 and FIG. 2, the processor 102 executes the computer program codes 106 to perform a pre-simulation 210 by applying the FE variations 130. For illustration in FIG. 2, the pre-simulation 210 is performed with a device 214, in some embodiments, having a relatively long channel length. For the pre-simulation 210, the device 214 is implemented by devices 216 stacked in series, for illustration, in advance process node. For illustration in FIG. 2, the devices 216 are transistors.

The devices 216 stacked in series, shown in FIG. 2, are given for illustrative purposes. Various configurations of the devices 216 are within the contemplated scope of the present disclosure. For example, in some embodiments, the device 214 is implemented by the devices 216 that are stacked in parallel.

Moreover, in some embodiments, the device variation translator 122 is applied for split devices configured with serial and/or parallel circuit configuration. Alternatively stated, the device variation translator 122 is able to be applied in analysis of the pre-simulation 210 for devices stacked in series and/or parallel.

In some embodiments, the devices 216 interconnected to other devices in the IC are operated as one or more functional circuits or components. The functional circuits or components include, for example, memory, processor, sensors, amplifiers, power distribution circuitry, input/output circuitry, or the like. One of ordinary skill in the art will appreciate that the above examples are given for illustrative purposes. Various functional circuits or components including, for example, resistors, capacitors, inductors, or the like, are within the contemplated scope of the present disclosure.

Moreover, for illustration in FIG. 1 and FIG. 2, the processor 102 executes the computer program codes 106 to perform a re-simulation 220. In some embodiments, when the re-simulation 220 is to be performed, a portion of the layout-related variations 132 is applied. For illustration in FIG. 2, the re-simulation 220 is performed with a critical component layout 222 including at least one device 216. For the re-simulation 220, the device 216 is split into devices 226 connected, for illustration, in parallel.

Furthermore, for illustration in FIG. 1 and FIG. 2, the processor 102 executes the computer program codes 106 to perform a post-simulation 230. In some embodiments, when the post-simulation 230 is to be performed, all of layout-related variations 132 are applied. For illustration in FIG. 2, the post-simulation 230 is performed with a circuit layout 232 including at least one device 216, dummy devices 239 and/or poly on OD edge ("PODE") structures (not shown). For the post-simulation 230, the device 216 is split into devices 236 connected, for illustration, in parallel, together with parasitic components including, for example, parasitic resistors 237 and parasitic capacitors 238 that are coupled with the devices 236.

The PODE described above indicates polysilicon structures that are formed along edges of an active area. In some applications, the dummy devices 239 and/or the PODE structures do not constitute any functional feature of the IC.

In some embodiments, the aforementioned active area is referred to as oxide-definition (OD) area. The OD area is provided to form a drain or a source of a transistor. In various embodiments of the present disclosure, the source of the transistor functions as the drain and vice versa. For illustration, the transistor is of a fin field effect transistor (FinFET) type, but planar type or various types of the transistor are within the contemplated scope of the present disclosure.

The simulations in FIG. 2 is given for illustrative purposes. Various simulations in FIG. 2 are within the contemplated scope of the present disclosure. Moreover, the number of simulations in FIG. 2 is given for illustrative purposes as well. Various numbers of simulations in FIG. 2 are also within the contemplated scope of the present disclosure.

Figure 3:
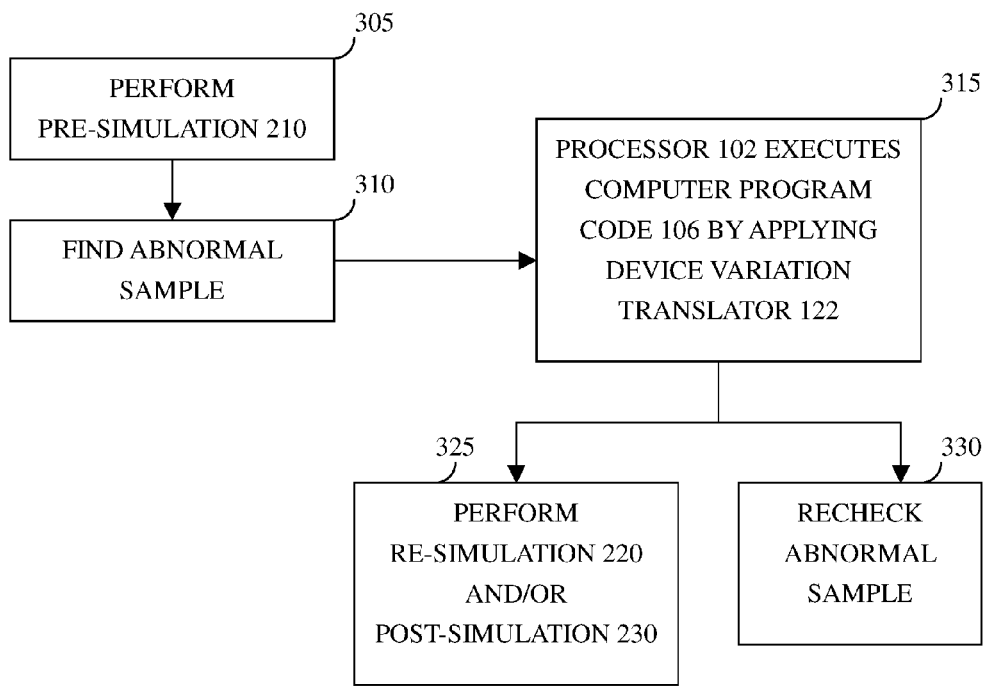
FIG. 3 illustrates a flow chart of a method implemented by the system of FIG. 1 in accordance with various embodiments of the present disclosure.

FIG. 3 illustrates a flow chart of a method 300 implemented by the system 100 of FIG. 1 in accordance with various embodiments of the present disclosure. The operations of the system 100 in FIG. 1 are described below by the method 300 illustrated in FIG. 3, with reference to the simulations in FIG. 2. Labels for different operations of the method 300 are illustratively provided in FIG. 3.

The above illustrations include exemplary operations, but the operations are not necessarily performed in the order shown in FIG. 3. Operations may be added, replaced, changed order, and/or eliminated as appropriate, in accordance with the spirit and scope of various embodiments of the present disclosure.

In the method 300, the processor 102 is configured to execute the computer program codes 106 encoded in the computer readable storage device 104. Accordingly, the system 100 is operable for performing a portion or all of the operations including, for example, operations 305, 310, 315, 325 and 330 as described below.

In some embodiments, operations 305 and 310 correspond to the pre-simulation 210 as illustrated in FIG. 2. Operations 325, 330 and 335 correspond to the re-simulation 220 and/or post-simulation 230 as illustrated in FIG. 2.

In operation 305, the processor 102 executes the computer program codes 106 to perform the pre-simulation 210 by applying the FE variations 130. In such an operation, a systematic verification is able to be performed in the pre-simulation 210, for illustration, with at least one device 214 as illustrated in FIG. 2.

For the pre-simulation 210, an initial design of the IC is developed at the transistor level, in the form of a transistor-based net-list or schematic view. The net-list is a nodal description of transistors, and the connections thereof. For illustration, the transistors include N-type metal-oxide semiconductor (NMOS) and/or P-type metal-oxide semiconductor (PMOS).

In order to perform operation 310, through the pre-simulation 210, the processor 102 executes the computer program codes 106 to apply the FE variations 130. Accordingly, the simulation result 140 is obtained and stored in the storage device 104, as discussed above. The simulation result 140 indicates at least one sample of the IC, in which the sample indicates simulation data that are related to characteristics of at least one component in the IC.

In some embodiments, performing the pre-simulation 210 generates various samples of the IC by applying the FE variations 130. The processor 102 executes the computer program codes 106 to identify the samples. For illustration, at least one sample is identified as being abnormal, as compared with the other samples. For example, a performance parameter of the abnormal sample is lower than performance parameters of the normal samples.

In operation 310, at least one abnormal sample including, for example, samples of large mismatch, is identified. Accordingly, with the pre-simulation 210, the abnormal samples are able to be identified. As a result, design failures are able to be identified early in the simulation process.

In operation 315, in some embodiments, the processor 102 executes the computer program codes 106 in order to perform the re-simulation 220 by applying a portion of the layout-related variations 132. In some embodiments, a portion of the layout-related variations 132 is applied according to a design rule.

For illustration, the devices 226 in FIG. 2 have individual variables. When the re-simulation 220 is to be performed, the individual variables are translated by the device variation translator 122 to an equivalent variable for the split devices 226. Furthermore in operation 315, the device variation translator 122 is applied to select a corresponding one of the device models 150 according to a factor value. The device variation translator 122 is also applied to access the corresponding one of the device models 150 to determine the equivalent variable for the split devices 226, for performing the re-simulation 220.

In some embodiments, the factor value is determined based on a device type, device geometry, LDE, and/or a configuration of the split devices 226 as illustrated in FIG. 2. The device type includes, for example, a transistor type, a resistor type, a capacitor type, and an inductor type.

In operation 325, in some embodiments, the re-simulation 220 is performed with the equivalent variable for the split devices 226 in the critical component layout 222. After the re-simulation 220, the simulation result 141 is obtained and stored in the storage device 104, and serves as a basis of modifying the layout for fabrication of the IC.

With the device variation translator 122, individual variables of the split devices 226 are translated to an equivalent variable for the re-simulation 220. As a result, simulation time required for the re-simulation 220 is reduced.

In alternative embodiments, when the re-simulation 220 is not to be performed, operation 330 is performed. In operation 330, the abnormal samples as identified in operation 310 are rechecked, for illustration, in the re-simulation 220. Since only the abnormal samples are rechecked, the simulation time is further reduced accordingly.

In some approaches. Integrated Circuit Emphasis (SPICE) simulations use a technique referred to as Monte-Carlo modeling, where the IC is simulated a large number of times with different, randomly-chosen device parameters selected for each simulation. Each simulation provides a different point on a process corner chart. Thus, some simulated device parameters result in fast/fast or slow/slow devices or ICs, other simulated device parameters result in skewed devices or ICs, while still other simulated device parameters result in devices or ICs falling elsewhere within the polygonal bounds of process corners provided by a fabrication facility. However, carrying out the vast number of Monte Carlo simulations required to identify whether an IC might fail to meet its design specifications can take a significant amount of time and computing resources.

Compared to the aforementioned approaches, only the abnormal samples as identified in operation 310 are rechecked without above Monte Carlo analysis. Moreover, the device variation translator 122 is applied in the simulation. Accordingly, an equivalent variable for the split devices 226, determined by the device variation translator 122, is able to be used in the simulation, in order to reduce simulation time.

Moreover, in operation 315, in some other embodiments, the processor 102 executes the computer program codes 106 to perform the post-simulation 230 by applying all of the layout-related variations 132.

Correspondingly, when the post-simulation 230 is to be performed, the individual variables of the split devices 226 are translated by the device variation translator 122 to an equivalent variable for the split devices 226. In some embodiments, individual variables of the parasitic resistors 237, and/or the parasitic capacitors 238, and/or the dummy devices 239 are further translated by the device variation translator 122. In addition, the device variation translator 122 is applied to select a corresponding one of the device models 150 according to the factor value as discussed above. The device variation translator 122 is also applied to access the corresponding one of the device models 150 to determine the equivalent variable for the split devices 226, for performing the post-simulation 230.

Afterwards, in operation 325, in some other embodiments, the post-simulation 230 is performed with the equivalent variable for the split devices 226. In some alternative embodiments, the post-simulation 230 is further performed with the equivalent variable for the parasitic resistors 237, and/or the parasitic capacitors 238, and/or the dummy devices 239 in the circuit layout 232. After the post-simulation 230, the simulation result 142 is obtained and stored in the storage device 104, and serves as a basis of modifying the layout for fabrication of the IC.

With the device variation translator 122, individual variables of the devices in the circuit layout 232 are translated to an equivalent variable for the post-simulation 230. As a result, simulation time required for the post-simulation 230 is reduced.

In some embodiments, the method 300 takes the form of a computer program product stored on a non-transitory computer-readable storage medium having computer-readable instructions embodied in the medium. The aforementioned computer is a central process unit, a control unit, a microprocessor, or the equivalents. Any suitable non-transitory storage medium is used including non-volatile memory such as read only memory (ROM), programmable read only memory (PROM), erasable programmable read only memory (EPROM), and electrically erasable programmable read only memory (EEPROM) devices; volatile memory including, for example, static random access memory (SRAM), dynamic random access memory (DRAM), and double data rate random access memory (DDR-RAM); optical storage devices including, for example, compact disc read only memories (CD-ROMs) and digital versatile disc read only memories (DVD-ROMs); and magnetic storage devices including, for example, hard disk drives (HDD) and floppy disk drives.

In view of above, the present disclosure provides variation analysis flows in different design phases. The device variation translator 122 sets the equivalent variable for the split devices in the re-simulation 220 and/or the post-simulation 230 to avoid complex computing. The re-simulation 220 and/or the post-simulation 230 reuses the particular Moreover, identified samples of the pre-simulation 210. As a result, the simulation time is reduced.

In some embodiments, a method is disclosed that includes: performing a first simulation by applying first variations to identify at least one sample of an integrated circuit (IC), wherein the IC comprises at least one device;

translating individual variables of split devices implementing the at least one device, to an equivalent variable for the split devices; and performing a second simulation, by applying at least a portion of second variations, with the equivalent variable for the split devices, to obtain a simulation result serving as a basis of modifying the layout for fabrication of the IC.

Also disclosed is a non-transitory computer readable medium comprising computer executable instructions for carrying out a method is disclosed, and the method includes applying front-end (FE) variations to perform a first simulation for obtaining a first simulation result, wherein the first simulation result indicates at least one sample of an IC, and the IC comprises at least one device; applying at least a portion of layout-related variations to obtain individual variables of split devices implementing the at least one device; translating the individual variables to an equivalent variable for the split devices; and performing a second simulation with the equivalent variable for the split devices serving as a basis of modifying the layout for fabrication of the IC.

Also disclosed is a system is disclosed that includes a processor and a storage device. The storage device stores a computer program code, and the computer program codes are executed by the processor to perform at least one of: performing a first simulation by applying FE variations to obtain a first simulation result, wherein the first simulation result indicates at least one sample of an IC, and the IC has at least one device; splitting the at least one device into a plurality of split devices in a layout of the at least one sample of the IC by applying one or more of layout-related variations, wherein the split devices have individual variables; translating the individual variables to an equivalent variable for the split devices in a second simulation; and rechecking the at least one sample of the IC in the second simulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    performing a first simulation on a design of an integrated circuit (IC) by applying first variables that are associated with simulation for front-end-of-line (FEOL) processes, to identify at least one simulation sample of the integrated circuit (IC), wherein the IC comprises at least one first device and second devices that are part of the integrated circuit, the second devices used to implement the at least one first device;
    translating a plurality of individual variables for the second devices from the at least one simulation sample of the integrated circuit (IC), to an equivalent variable that is configured to represent the plurality of individual variables for each of the second devices;
    performing a second simulation, by applying the equivalent variable to the second devices and at least a portion of second variables to other portions of the IC, to obtain a simulation result serving as a basis of modifying a layout for fabrication of the IC; and
    fabricating the IC based on the modified layout.

2. The method of claim 1, wherein the second variables are associated with at least one of: layout-related effects and environment variations.

3. The method of claim 2, wherein the layout-related effects are associated with at least one of: layout dependent effect (LDE), middle-end-of-line (MEOL) processes, and back-end-of-line (BEOL) processes.

4. The method of claim 1, wherein translating the plurality of individual variables comprises:
    determining the equivalent variable according to a factor value,
    wherein the factor value is determined based on at least one of: a device type, device geometry, layout dependent effect (LDE), and a configuration of the second devices.

5. The method of claim 1, wherein the second devices are configured in serial connection and/or parallel connection.

6. The method of claim 1, wherein performing the first simulation comprises:
    identifying various simulation samples of the IC by applying the first variables; and
    identifying the at least one simulation sample that has a performance parameter lower than performance parameters of others of the various simulation samples of the IC.

7. The method of claim 1, wherein the at least one simulation sample of the IC indicates simulation data that are related to characteristics of at least one component in the IC.

8. The method of claim 6, further comprising:
    rechecking the at least one simulation sample.

9. The method of claim 1, wherein the second simulation is a post-simulation, and the second simulation is performed by applying all of the second variables.

10. A method comprising:
    determining an equivalent variable that is configured to represent a plurality of individual variables for each of second devices, wherein the second devices are used to implement at least one first device of an integrated circuit (IC);
    performing a first simulation, by applying the equivalent variable to the second devices and at least a portion of first variables, which are associated with at least one of: layout-related effects and environment variations, to other portions of the IC, to obtain a simulation result serving as a basis of modifying a layout for fabrication of the IC; and
    fabricating the IC based on the modified layout;
    wherein at least one of the determining and the performing is performed by a processor.

11. The method of claim 10, wherein the layout-related effects are associated with at least one of: layout dependent effect (LDE), middle-end-of-line (MEOL) processes, and back-end-of-line (BEOL) processes.

12. The method of claim 10, wherein determining the equivalent variable comprises:
    determining the equivalent variable according to a factor value,
    wherein the factor value is determined based on at least one of a device type, device geometry, layout dependent effect (LDE), and a configuration of the second devices.

13. The method of claim 10, further comprising:
performing a second simulation on the IC by applying second variables to identify at least one simulation sample of the IC,
wherein on condition that a performance parameter of the at least one simulation sample of the IC is lower than performance parameters of others of various samples of the IC, the at least one simulation sample is identified; and
rechecking the at least one simulation sample without Monte Carlo analysis.

14. The method of claim 13, wherein the second variables are associated with front-end-of-line (FEOL) processes.

15. A method comprising:
performing a first simulation on a design of an integrated circuit (IC) by applying first variables that are associated with simulation for front-end-of-line (FEOL) processes, in order to identify whether at least one simulation sample of the integrated circuit (IC) has a performance parameter lower than performance parameters of others of various samples of the IC, wherein the IC comprises at least one first device and second devices that are part of the integrated circuit, the second devices used to implement the at least one first device;
translating a plurality of individual variables for the second devices from the at least one simulation sample of the integrated circuit (IC) to an equivalent variable that is configured to represent the plurality of individual variables for each of the second devices in a second simulation;
rechecking the at least one simulation sample of the IC in the second simulation; and
fabricating the IC based on a result of performing the second simulation;
wherein at least one of the performing, the translating, and the rechecking is performed by a processor.

16. The method of claim 15, further comprising: performing the second simulation by applying second variables which are associated with at least one of layout-related effects and environment variations.

17. The method of claim 15, wherein translating the plurality of individual variables comprises:
determining the equivalent variable according to a factor value,
wherein the factor value is determined based on at least one of: a device type, device geometry, layout dependent effect (LDE), and a configuration of the second devices.

18. The method of claim 8, wherein rechecking the at least one simulation sample further comprises:
rechecking the at least one simulation sample without Monte Carlo analysis.

19. The method of claim 10, further comprising:
identifying at least one simulation sample of the IC on condition that a performance parameter of the at least one simulation sample of the IC is lower than performance parameters of others of various simulation samples of the IC.

20. The method of claim 15, wherein rechecking the at least one simulation sample further comprises:
rechecking the at least one simulation sample without Monte Carlo analysis.

* * * * *